United States Patent
Bermingham et al.

[19]

[11] Patent Number: 6,058,451
[45] Date of Patent: May 2, 2000

[54] METHOD AND APPARATUS FOR REFRESHING A NON-CLOCKED MEMORY

[75] Inventors: Michael Bermingham, Framingham; Christopher S. MacLellan, Norwood; Rizwan Sheikh, Grafton, all of Mass.

[73] Assignee: EMC Corporation, Mass.

[21] Appl. No.: 08/995,452

[22] Filed: Dec. 22, 1997

[51] Int. Cl.[7] .................................................. G06F 12/06
[52] U.S. Cl. .............................. 711/106; 711/5; 711/173; 365/222; 365/230.03; 365/230.05; 713/600
[58] Field of Search ..................................... 711/106, 148, 711/149, 150, 168, 173, 5; 365/222, 230.03, 230.05; 713/500, 502, 600

[56] References Cited

U.S. PATENT DOCUMENTS

| | | | |
|---|---|---|---|
| 4,797,850 | 1/1989 | Amitai ..................................... | 711/106 |
| 5,265,231 | 11/1993 | Nuwayser ............................... | 711/106 |
| 5,634,106 | 5/1997 | Yaezawa et al. ........................ | 711/106 |
| 5,682,498 | 10/1997 | Harness .................................... | 711/106 |
| 5,835,937 | 11/1998 | Miyoshi ................................... | 711/106 |
| 5,893,927 | 4/1999 | Hovis ....................................... | 711/171 |
| 5,956,288 | 9/1999 | Bermingham et al. ............. | 365/230.06 |

*Primary Examiner*—Hiep T Nguyen
*Attorney, Agent, or Firm*—Brian L. Michaelis, Esq.; Jacques B. Miles, Esq.; Brown Rudnick Freed & Gesmer, PC

[57] ABSTRACT

An optimized memory refresh scheme controls and reduces instantaneous power consumption and power-related noise during DRAM refresh. In the optimized refresh implementation the DRAM is refreshed using a selectable overlap Column Address Select (CAS) before Row Address Select (RAS) refresh mode. A refresh interface between a host port and the memory system is over two bussed signals comprised of a Refresh Enable signal (Refresh_Enable) and a Refresh Strobe pulse train (Refresh_Strobe). Refresh_Enable is issued by the host port to define a refresh operation. Refresh_Strobe is a pulse train generated by the host port which is used as a clock for a sequential refresh sequencer. A refresh sequencer issues selectably timed column address refresh and row address refresh signals according to which the memory banks can all be selectably refreshed substantially in parallel, or with a predetermined selected level of overlap. Optimized skewing can be implemented to minimize the time for refresh. Refreshing of different memory banks can be selectably overlapped to provide acceptable current and noise profiles during refresh.

16 Claims, 9 Drawing Sheets

METHOD AND APPARATUS FOR REFRESHING A NON-CLOCKED MEMORY

FIELD OF THE INVENTION

The present invention relates to memory systems, and more particularly to methods and apparatus for refreshing DRAM memory used in electronic systems.

BACKGROUND OF THE INVENTION

Modular memory array systems known in the art are configured by organizing banks of appropriately sized memory chips. Such systems are typically comprised of multiple banks of memory having shared access over a connector or other restricted interconnect system, i.e. finite bandwidth busses. For instance, sixteen 16M×4 Dynamic Random Access Memory (DRAM) chips can be organized to give one bank of 128 megabytes of memory that is 64 bits wide and 16 megabytes deep. Typically, in order to get more (i.e. deeper) memory, more banks of the same size are added with the same word size (width). Addressing of memory within a particular bank normally involves coding (and decoding) particular bits of the memory address bus to indicate a selected bank. That is, in order to access a selected bank of the multiple banks of shared memory, the particular bank to be accessed is determined by decoding certain bits of the memory system address bus. For example, in a multi-bank system with 4 banks of 128 megabytes of memory per bank that is 64 bits wide and 16 megabytes deep, the memory address bus can be coded as follows: the first twelve bits of the address bus (A[11:00]) are the DRAM column address; the next twelve bits (A[12:23]) are the DRAM row address; and the last two bits (A[25:24]) are the bank select bits. The bank select is usually implemented such that only the selected bank's control lines will be active, i.e., control line signals will not be driven to every bank. Thus only one bank is accessed at one time.

One known type of modular memory array system, illustrated in FIG. 1A, has the memory address distributed by a single buffering mechanism. Bank selection of one of the banks (bank 0, bank 1 . . . bank N), is accomplished by unique control signals mutually exclusively issued to the respective bank being selected. In the system illustrated in FIG. 1A, three control signals are sent to a control buffer 20, but the three signals are sent via the buffer 20 only to the bank being selected (although three signal lines are routed between the control buffer 20 and the memory banks, only one control line is shown for simplicity in the drawing).

In this known implementation, address lines (again only one shown for simplicity), are buffered by an address buffer 22 such that the same (logical) copy is routed to each bank. Accordingly, toggling memory addresses are seen at each of the memory banks whether the bank is being selected or not, which results in increased switching noise. Other problems result, in that for systems with a significant number of banks, high-current drivers and/or multiple (physical) copies of the address may have to be used to drive the address lines which are always driven to every bank (unlike the control lines). Disadvantageously, power consumption on the memory array is greater, and/or physical space requirements for driving the memory address are increased.

Another known modular memory array system implementation is illustrated in FIG. 1B. In this implementation a unique copy of the address is distributed from a port controller 24, through an address buffer 26 to the selected bank, so that switching occurs only at the address of the bank being accessed. This scheme has the advantage of reduced switching noise and power consumption on the memory array. Major disadvantages, however, are associated with the requirement for issuing a unique address to the address buffer for each memory bank. On a memory array accessed over a connector, like a daughter card system, the input/output (I/O) requirements of the connector increase. Worse still, is the fact that the I/O requirements (i.e. pin out) of the driving port, usually an application specific integrated circuit (ASIC), increase proportionately. Further, greater amounts of physical space on the memory array card are required to accommodate the increased I/O requirements.

In all DRAM memory array implementations, the memory chips must be accessed periodically to refresh the information stored in the DRAMs. Refresh operations, if not optimized in terms of timing and duration, may negatively impact memory system bandwidth. Refresh operations also require significant amounts of power to cycle through the DRAM memory bank(s), adding to the power requirements of the memory array. Known refresh schemes themselves can introduce noise in the system as a result of current surges that occur during transition times in the refresh cycle. In-rush current surges can cause "ground-bounce" which can lead to spurious data corruption and/or loss of data. In large memory arrays refresh currents are significant and can account for a major portion of the DRAM power dissipation. Significantly higher power consumption can lead to the need to use larger, higher power components, and may, introduce difficulties associated with heat buildup in and around the memory array.

SUMMARY OF THE INVENTION

The present invention provides a modular memory array configuration that uses a combinatorial decoding device in conjunction with a memory array, instead of straight buffering, to effect optimal delivery of control and address signals, and includes an optimized memory refresh scheme that controls and reduces instantaneous power consumption and power-related noise during DRAM refresh.

According to the invention, each port accessing memory on the modular memory array drives a single copy of address and control signals, plus bank select signals, over a shared tri-state interface to a combinatorial decoding device (decoder). The bank select is multiplexed off of the system address from control port(s), and controls the decoder which drives the address and control to only the accessed bank. Address and control signals to all banks but the accessed bank, are pulled up (inactive) with resistors on the memory array. For N banks, log2 N bank select bits are needed. That is, in a four bank system only two bank select lines are needed and in an eight bank system only three bank select lines are needed to select the bank to which address signals are delivered.

In further accord with the invention, in an optimized refresh implementation the DRAM is refreshed using a selectable overlap Column Address Select (CAS) before Row Address Select (RAS) refresh mode. A refresh interface between a host port and the memory system is over two bussed signals comprised of a Refresh Enable signal (Refresh_Enable) and a Refresh Strobe pulse train (Refresh_Strobe). Refresh_Enable is issued by the host port to define a refresh operation. Refresh_Strobe is a pulse train generated by the host port which is used as a clock for a sequential refresh sequencer. The refresh sequencer issues selectably timed column address refresh and row address refresh signals according to which the memory banks can all be selectably refreshed substantially in parallel, or with a predetermined selected level of overlap. The Refresh_Strobe pulse train is enveloped by the Refresh_Enable asserted.

Features of the invention include a combinatorial decoder device which does not need to be clocked and therefore avoids problems associated with selecting between and providing asynchronous or redundant clocks for a mult-ported shared memory with ports independent of and asynchronous to one another. Output glitches inherent to combinatorial decoders are avoided on the output control signals in the implementation according to the invention, by having the port controller that is performing a memory access first switch the bank select signals while all other inputs, i.e. address and control lines, are stable and fixed in a logical inactive state. The bank select value is maintained for the duration of the memory access, while the other inputs may switch. The decoder implementation according to the invention minimizes the pin requirements for port controllers and memory array connectors. Simultaneous switching output noise on both the port controllers and memory array address/control drivers is also minimized.

The refresh mechanism according to the invention provides an efficient refresh scheme with effectively programmable skewing of the refreshing of memory banks. Optimized skewing can be implemented to minimize the time for refresh. Refreshing of different memory banks can be selectably overlapped to provide acceptable current and noise profiles during refresh.

BRIEF DESCRIPTION OF THE DRAWING

The foregoing and other features and advantages of the present invention will be more fully understood from the following detailed description of illustrative embodiment, taken in conjunction with the accompanying drawing in which.

DETAILED DESCRIPTION OF THE INVENTION

Figure 1A:
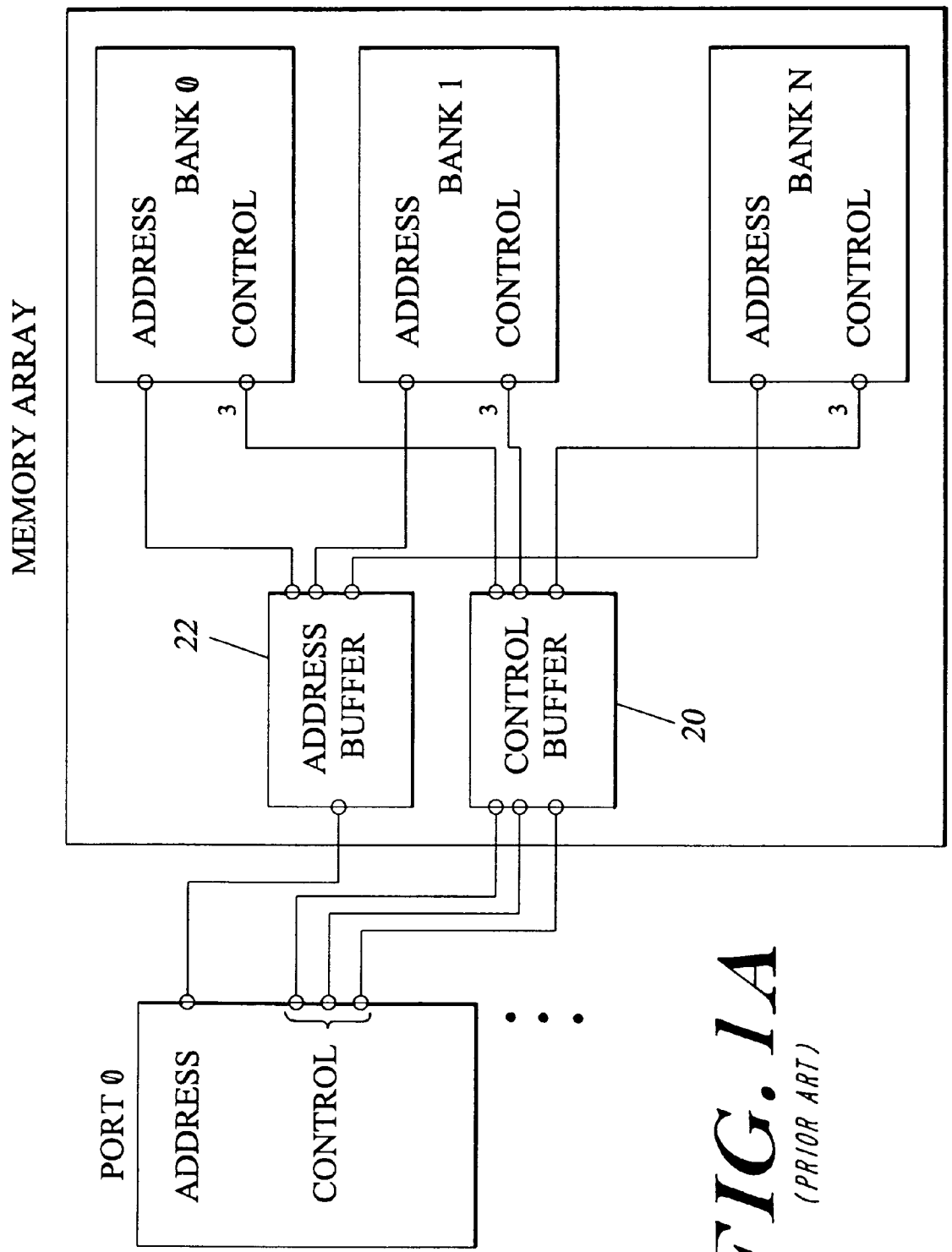
FIGS. 1A and 1B schematic diagrams of examples of multiple bank shared memory array addressing implementations according to the prior art.
Figure 1B:
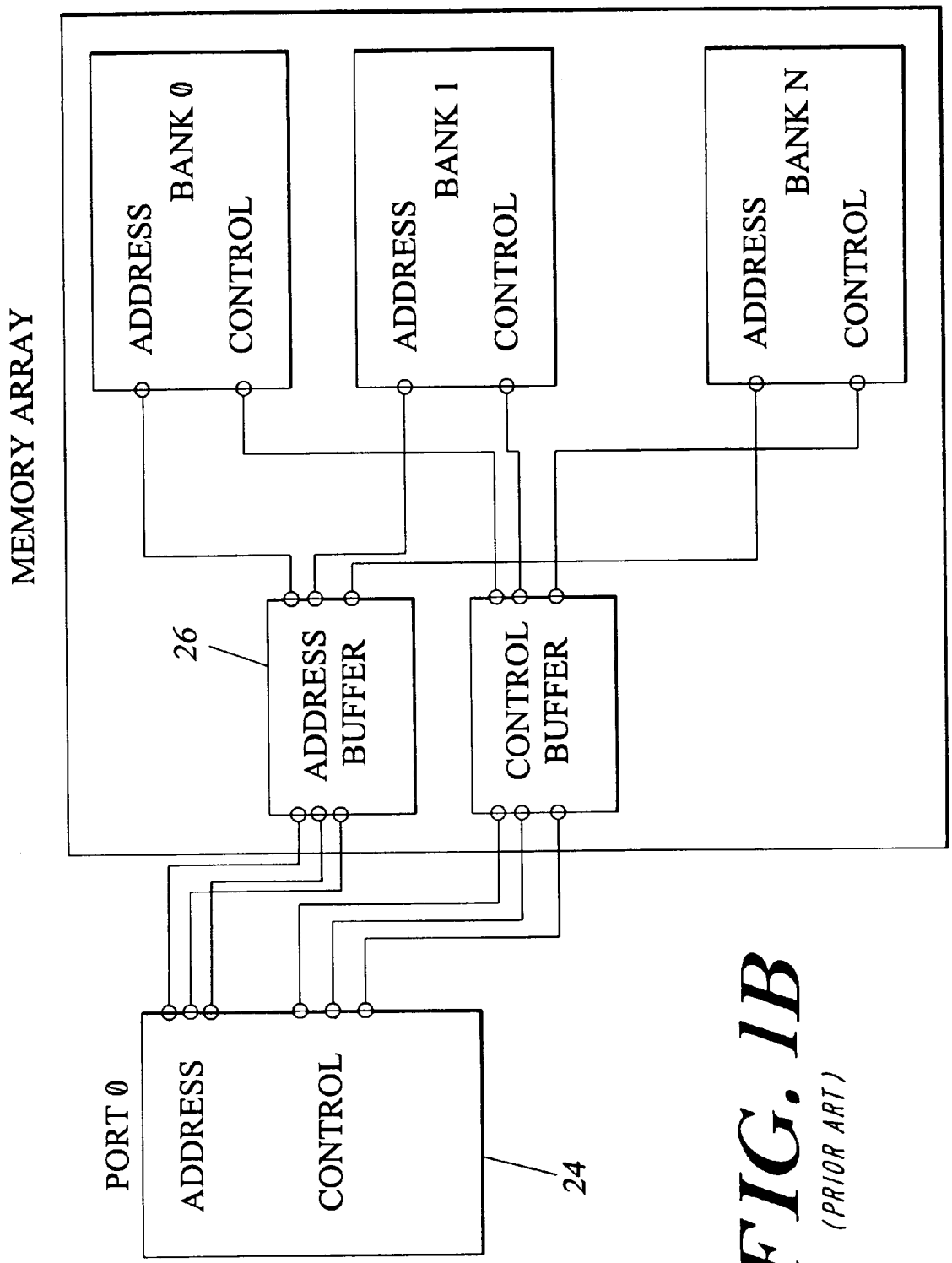
Figure 2:
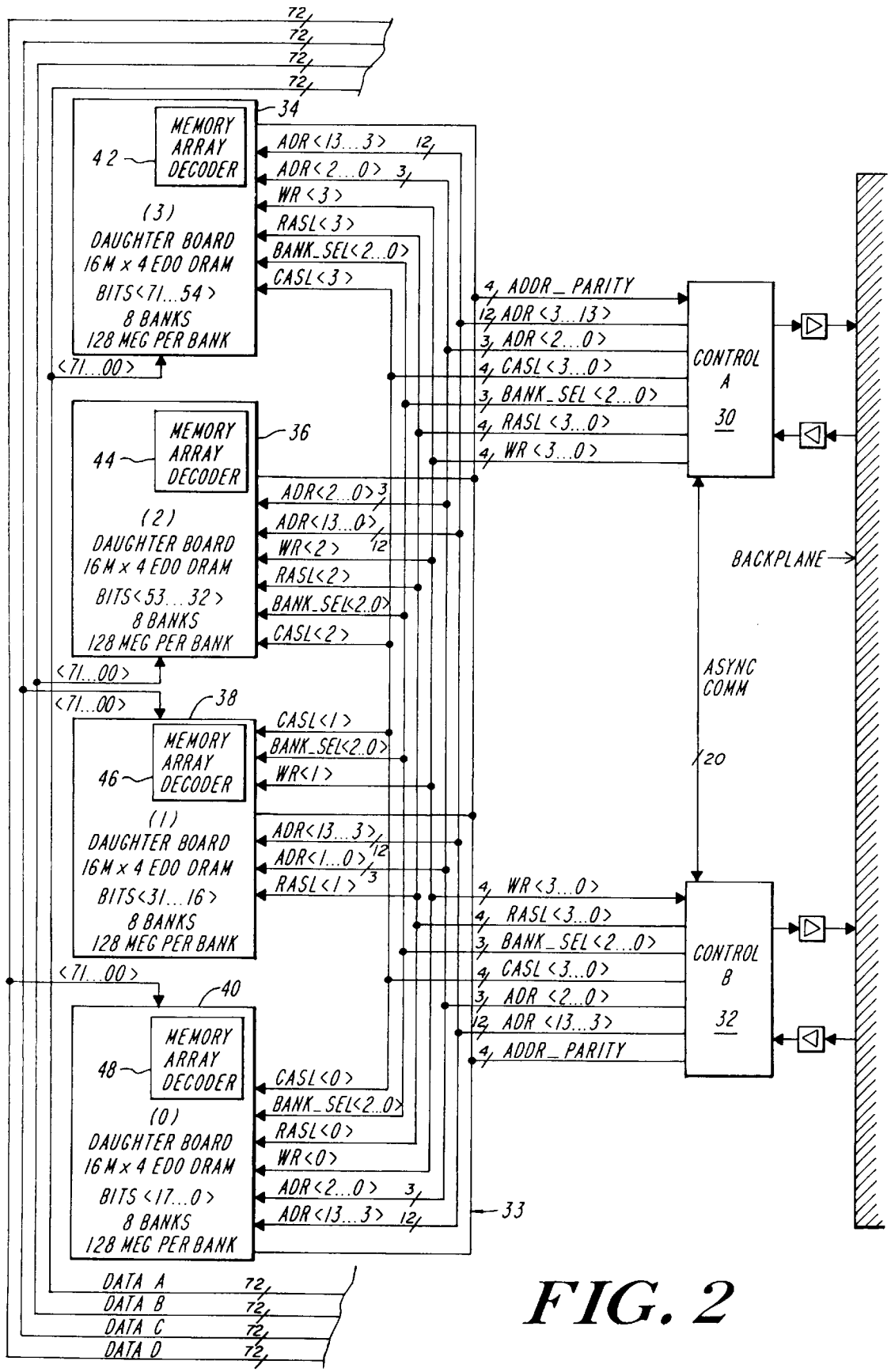
FIG. 2 is a schematic diagram of a multiple port, multiple bank shared memory array implementation according to the invention.

A combinatorial decoding device and/or programmable refresh according to the invention is implemented in the context of a multiple port, multiple bank shared memory array system, such as illustrated in FIG. 2. In this illustrative embodiment, a multi-port redundant architecture is implemented having two ports each controlled by respective port controllers 30, 32 (port controller A and port controller B), configured so that each port can access the shared memory as a fully independent channel. The port controllers 30, 32, issue control and address signals to a plurality of shared memory banks.

The shared memory banks in this embodiment are comprised of four daughter boards 34, 36, 38, 40 each of which has 16M×4 Dynamic Random Access Memory (DRAM) chips organized as eight banks of memory with 128 Megabytes per bank. Each of the four daughter boards 34, 36, 38, 40, includes a respective memory array decoder ASIC or device according to the invention 42, 44, 46, 48. Each of the memory array decoder devices 42, 44, 46, 48 is connected to each of the port controllers 30, 32, via a control ASIC interface or bus 33 that provides address signals and control signals. In this illustrative embodiment the control signals are comprised of three bits for bank select signals (BANK_SEL), four bits for column address select (CAS), four bits for row address select (RAS), and four bits for write enable signals (WR).

Figure 3:
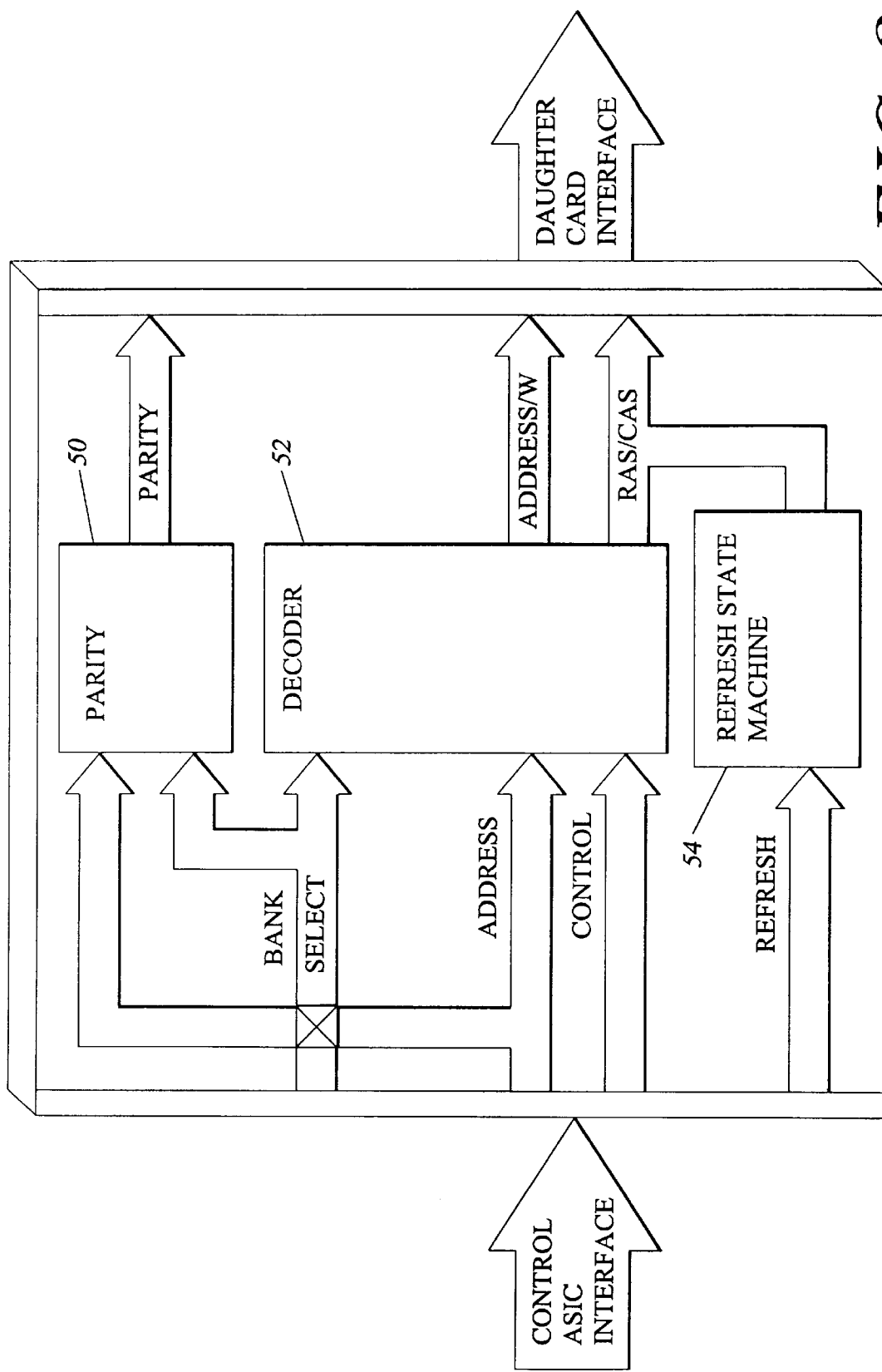
FIG. 3 is a block diagram of a memory array decoder for implementation on a set of memory banks in the multiple bank shared memory array implementation of FIG. 2.

The memory array decoder ASICs 42, 44, 46, 48 are block diagrammatically illustrated in FIG. 3. Each device is comprised of parity logic 50 generating address parity as known in the art, an address buffer/decoder 52 according to the invention which receives address and control signals and issues address and control signals only to the selected memory bank, and a refresh state machine 54 which receives refresh enable and strobe signals and effects optimized refresh according to the invention as described in detail hereinafter.

Figure 4A:
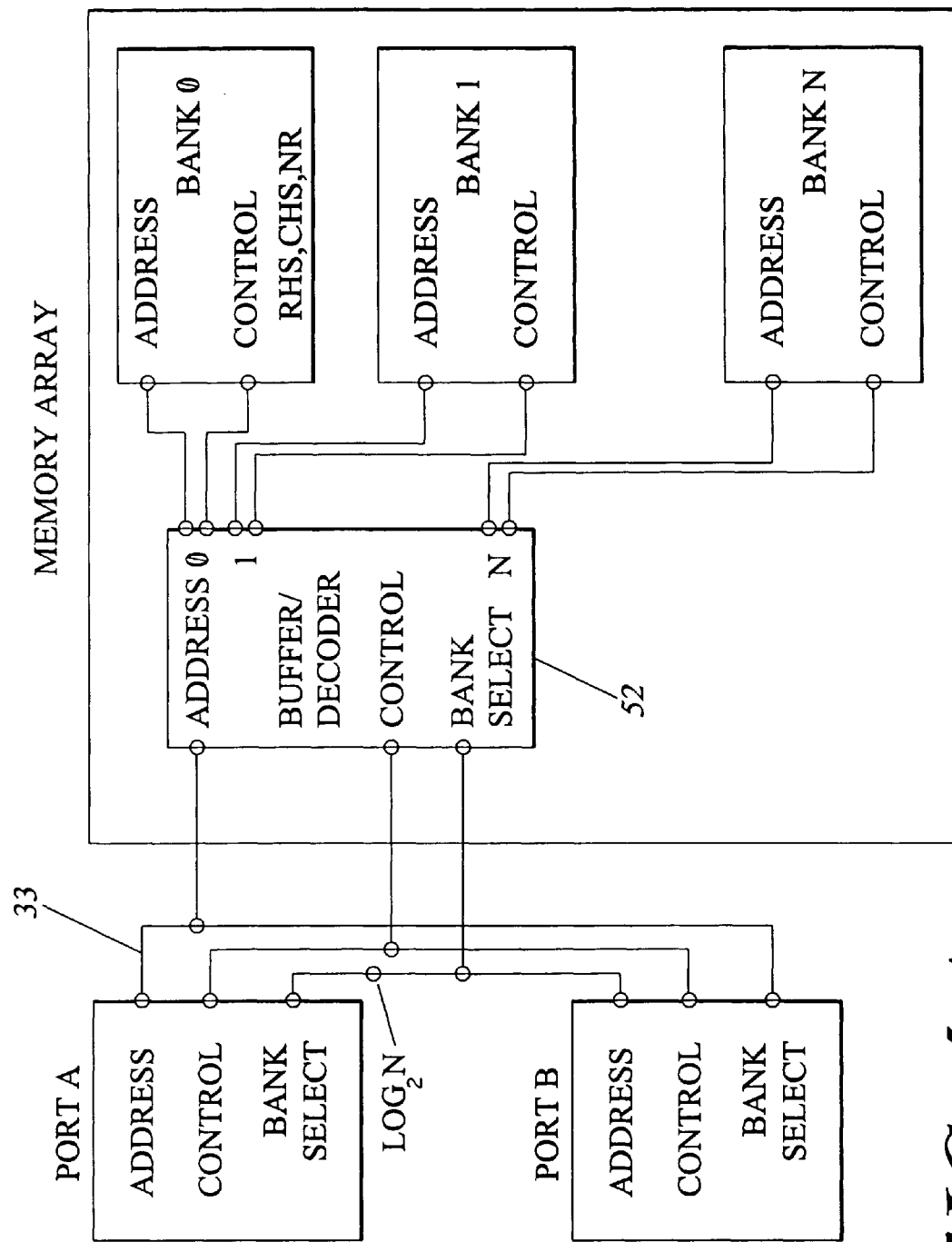
FIG. 4A is a schematic diagram of a memory array including a decoder in the multiple bank shared memory array implementation of FIG. 2.
Figure 4B:
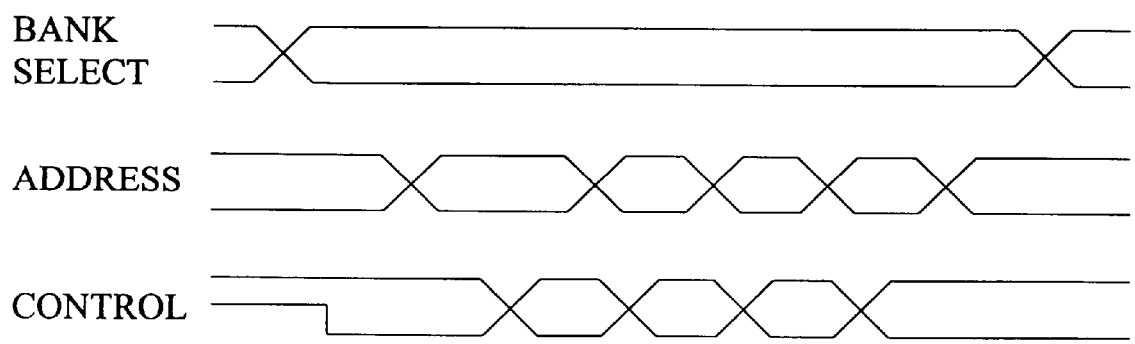
FIG. 4B is a timing diagram illustrating timing relationships of signals on the memory array of FIG. 4A.

The address buffer/decoder 52 according to the invention illustrated in greater detail in FIGS. 4A and 4B in the context of the memory array, is a combinatorial decoding device which provides buffering as known in the art, and also selectively drives the address and control signals of a selected memory bank (bank 0, bank 1 . . . bank N), as a function of bank select signals issued to the buffer/decoder 52. As illustrated in FIG. 4A, each port accessing the memory (port A, port B), drives a single copy of address and control signals, plus a bank select vector, over the shared tri-state interface, i.e. the control ASIC interface or bus 33 that provides address signals and parity, and control signals. For N banks, log2 N bank select bits are needed. The bank select signals control the decoder, which implements combinatorial logic to drive the address and control to only the bank to be accessed, as provided by the bank select signals. As known in the art, the combinatorial logic implementing the decoder does not require a clock (synchronous or asynchronous), therefore, problems associated with selecting and implementing such clocks are totally avoided. Address and control signals to all non-selected banks are pulled up (i.e. inactive) with resistors (not shown) on the memory array.

As illustrated in the timing diagram of FIG. 4B, the relationship between the bank select signals and the address and control signals in the implementation according to the invention is such that the bank select signals are issued first by the port controller(s) performing a memory access. Other inputs to the combinatorial buffer/decoder 52, i.e. the address and other control signals, are maintained in a stable and logically inactive condition. Address and control signals are subsequently issued during a period in which the bank select signals are maintained and can not toggle. That is, the value of the bank select signals is maintained stable for the duration of the memory access, while the other inputs may switch. In this manner, output glitches inherent to combinatorial decoders are avoided on the output control signals in the implementation according to the invention.

In the combinatorial decoding implementation described hereinabove, as applied to a dynamic memory system with N banks, only one bank can be accessed at a time. Thus, in a worst case scenario the refresh time increases to greater than N*tRF, where N is the number of banks and tRF is the time to refresh one bank. For an 8 bank system, the refresh time can easily exceed 10% of the available memory access time, accordingly decreasing the available bandwidth.

The refresh state machine implemented in the memory array decoder ASIC according to the invention provides a means to programmably implement selectively timed refresh in the DRAMs of the memory banks in the present illustrative embodiment. The present implementation allows for the capability of skewing the refreshing of the memory banks such that the refresh cycles for different banks are overlapped, but not performed exactly in parallel. A single refresh command to the memory array always refreshes one row of all banks. In this refresh scheme, the current draw is selectively evened out, and flexibility is provided in determining a selected time to perform the refresh cycle.

The refresh state machine implements a sequential refresh controller as a separate part of the decoder device. In refresh mode the DRAM is refreshed using CAS before RAS refresh mode. The refresh state machine drives the RAS and CAS for each DRAM bank during refresh. With appropriately selected timing in the sequential refresh controller the memory banks can be refreshed substantially in parallel, or with whatever level of overlap is desired.

Figure 5A:
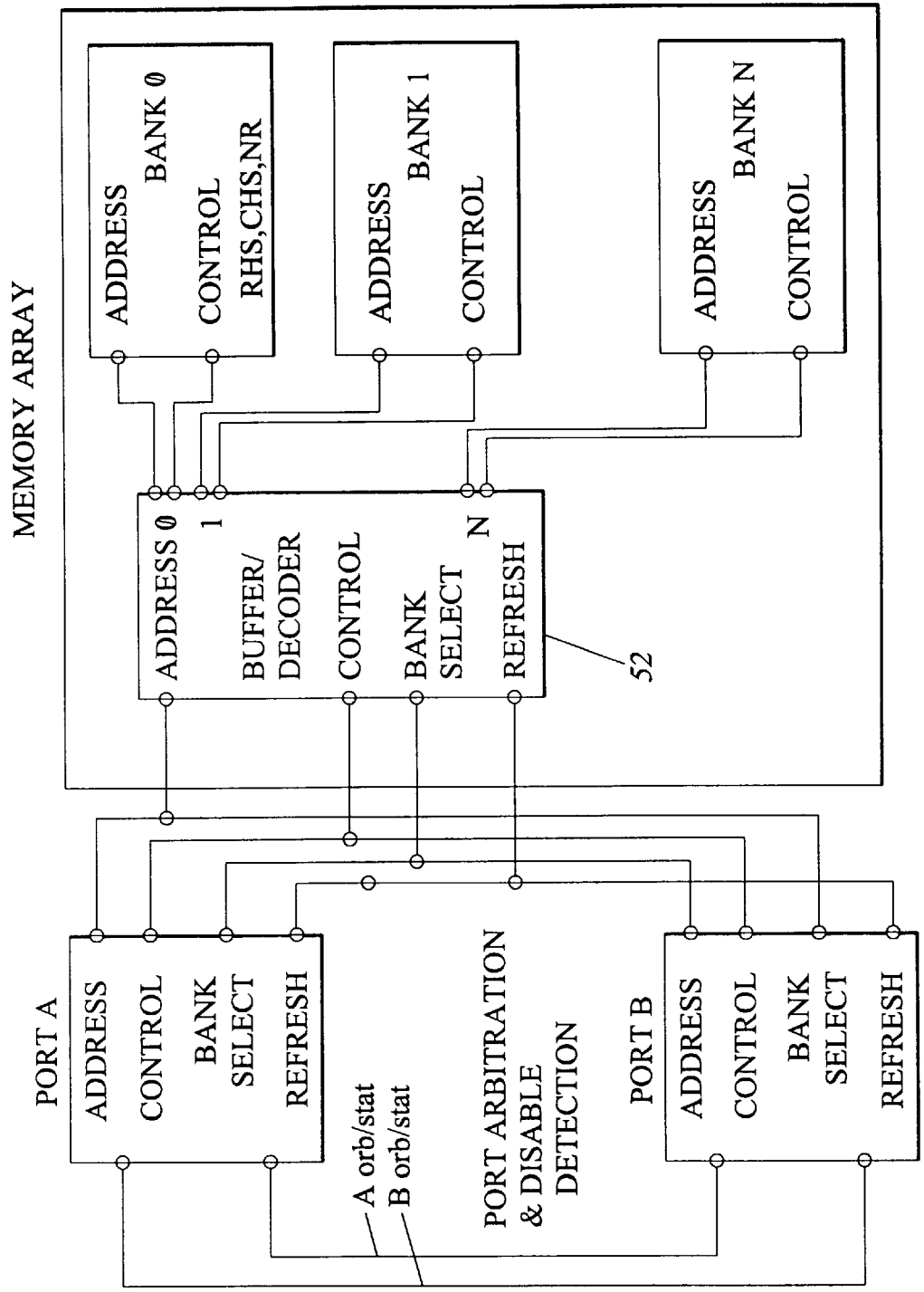
FIG. 5A is a schematic diagram of the memory array including a decoder in the multiple bank shared memory array implementation of FIG. 2 including refresh according to the invention.

As illustrated in FIGS. 3 and 5A, the control ports issue refresh control signals to the decoder 52 and the refresh state machine 54 of the memory array decoder ASIC(s). Thus the decoder ASIC enters refresh mode under the command of a host port. In a shared memory system, the ports arbitrate for access such that only one can access at any one time. The refresh control signals comprising the refresh interface between host port and the decoder device are two bussed signals: Refresh_Enable; and Refresh_Strobe. Refresh_Enable is an active low signal that defines a refresh operation. Refresh_strobe is a pulse train generated by the host port which is used as a clock for the sequential refresh sequencer of the decoder device. The Refresh_strobe pulse train is enveloped by the Refresh_Enable asserted, and is constituted by the number of pulses required to cycle through the RAS and CAS signals necessary to refresh the number of banks sought to be refreshed by the port controller.

Refresh_Enable, when de-asserted, is an asynchronous reset for the refresh sequencer or state machine flip flops, and serves to completely disable the refresh state machine when the memory is in normal operation, i.e. non-refresh mode. There is some flexibility designed into the total refresh time, as it is a function of the Refresh_Strobe clock period. Similarly, flexibility in the total refresh time in the system according to the invention is provided by the level of memory bank refresh overlap, as described in detail hereinafter. The minimum refresh time period is limited by the DRAM timing specifications.

In a multi-port redundant architecture (such as illustrated in FIGS. 2 and 5A), refresh requests are generated by each port independently. A typical refresh rate, determined by the DRAM specifications may be approximately 4K rows refreshed every 64 ms, which averages to approximately one refresh cycle every 15.63 microseconds. For M operating channels (i.e. non-disabled) in the multi-port redundant architecture each port can request a refresh every 15.63×M microseconds so that the refresh requests are effectively shared by the available ports. Such an implementation minimizes bandwidth degradation due to excessive refreshing in the multi-port system.

If a catastrophic fault is detected in any port in the multi-port redundant architecture, it can be disabled and memory access can continue over the remaining port(s). If any port becomes disabled, the remaining port(s) must increase their refresh frequency to compensate. The port controllers therefore include mechanisms for determining the status of all ports in the system, and can adjust the refresh rate as a function of the number of ports available over which refresh can be effected.

In this illustrative embodiment, the first and second port controllers (port A and port B) are electrically interconnected by signal lines, A arb/stat and B arb/stat, which make each port aware of the status of the other port. Thus the port controllers can issue Refresh_Enable and Refresh_Strobe signals and the refresh state machine(s) can selectively access memory banks independent of which port issues the refresh interface signals. In the event that a port is down and unable to refresh a portion of the memory, the entire memory can be refreshed by an available port by increasing the frequency of refresh and/or the Refresh_Strobe clock period.

Figure 5B:
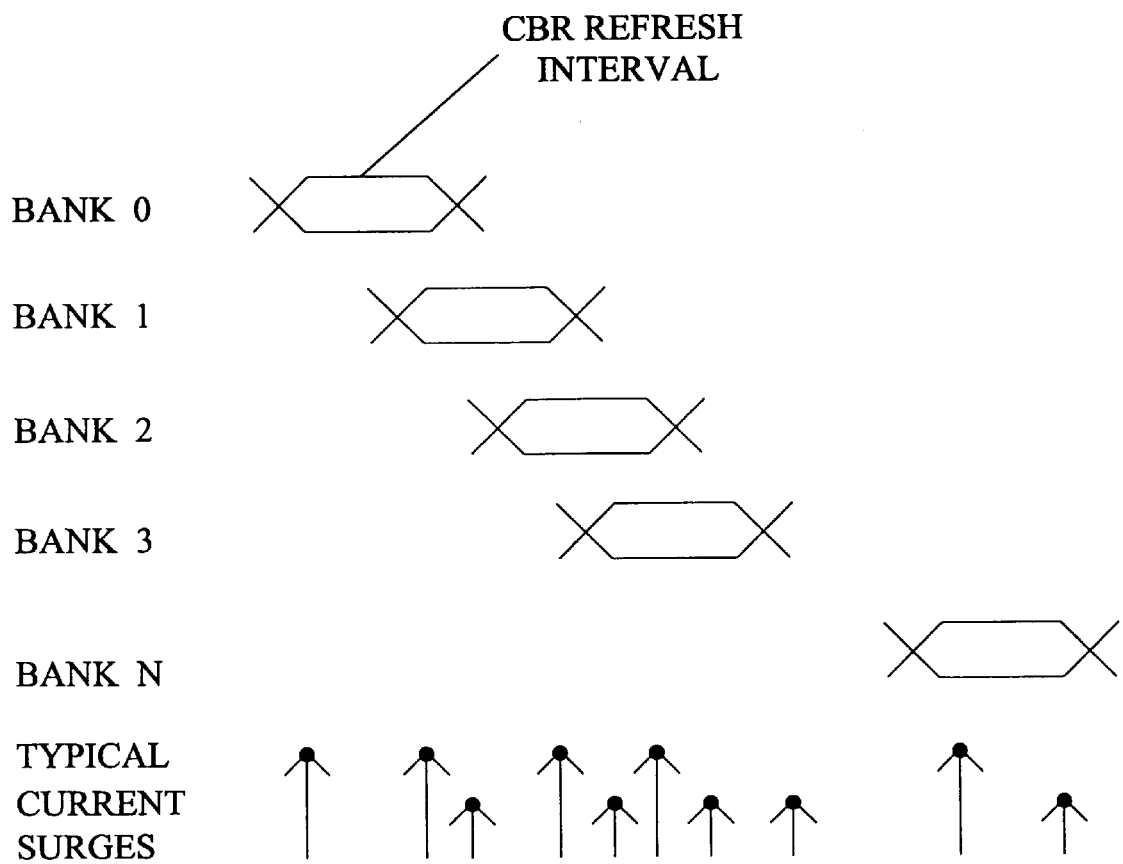
FIG. 5B is a timing diagram illustrating timing relationships of bank refresh and current surges on the memory array of FIG. 5A.

As illustrated generally in FIG. 5B, current surges occur during RAS and CAS transition times of CAS-before-RAS (CBR) refresh cycles. These refresh currents are significant for large memory arrays, and account for a major portion of the DRAM power dissipation. Implementation of a refresh state machine in conjunction with the combinatorial buffer/decoder according to the invention facilitates skewing of the refreshing of the memory banks.

Figure 6:
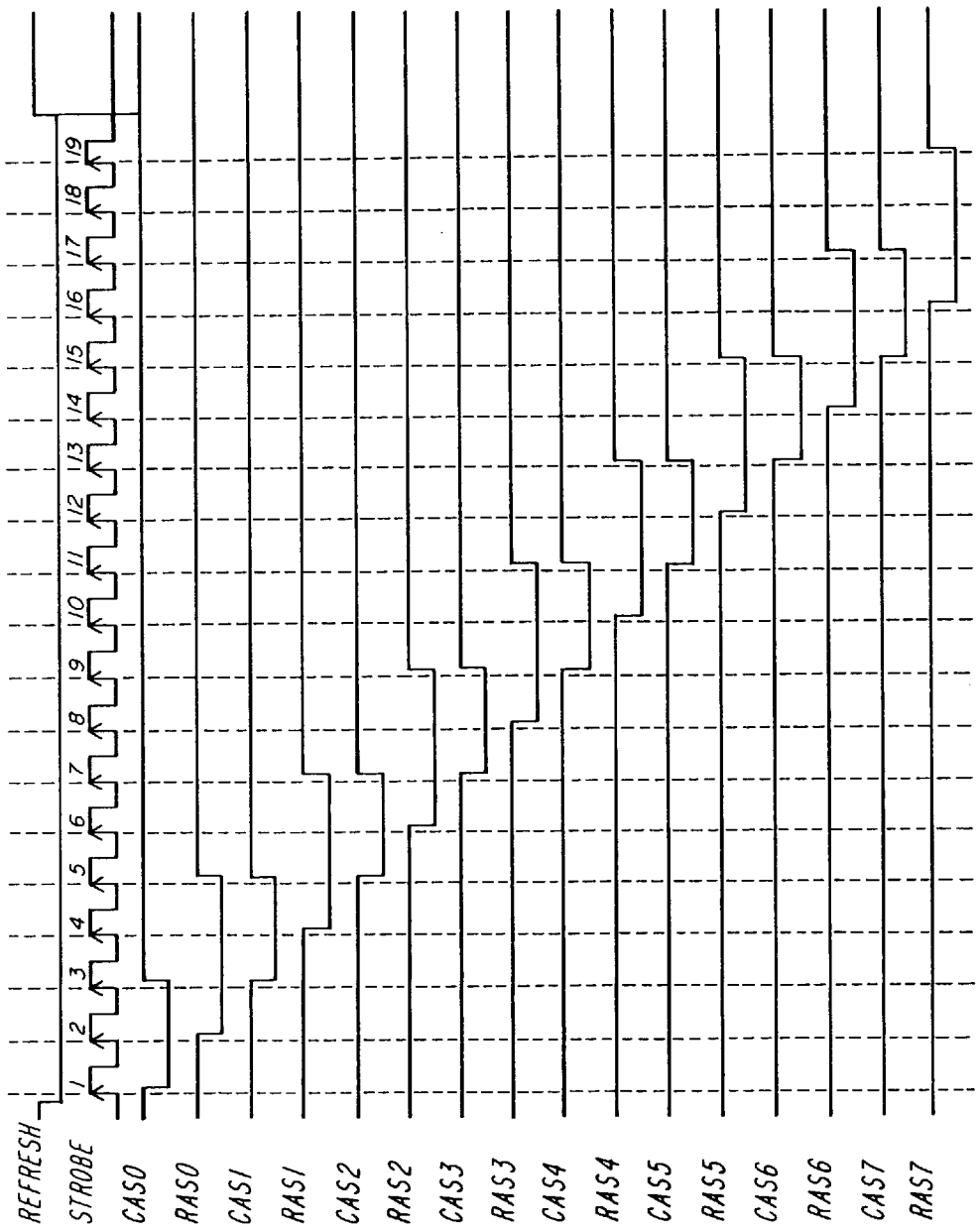
FIG. 6 is a timing diagram of a refresh state machine according to the invention implementing selectable skew.

Accordingly, as illustrated in FIG. 6, the refresh cycles for different banks (e.g. banks 0 through 7) can be optimally overlapped in order to minimize the effects of current surges during RAS and CAS transition times. The system, as illustrated, is configured so that a single refresh command to the memory array always refreshes one row of all banks, but not necessarily in parallel. By skewing the refresh the current draw is evened out, albeit at the expense of taking more time to perform the refresh cycle. The number of clock cycles of skew introduced can be set by implementing the refresh state machine as a programmable device, such as an AMD MACH4 or MACH5 Series device, or any of various Programmable Logic Devices (PLDs) known in the art. This allows the minimum skew (and time) to be determined, in real system environments, which will give acceptable current and noise profiles. Similarly, a PLD could be used in conjunction with another logic device implementing the refresh state machine in order to effect programmability and flexible optimization of refresh skewing.

The implementation of a combinatorial decoder ASIC including a buffer/decoder and refresh state machine as described hereinbefore minimizes the pin requirements for port controllers and memory array connectors, and also minimizes the simultaneous switching output noise on both the port controllers and memory array address/control drivers.

Although the combinatorial decoder and the selectable optimized refresh mechanism described herein according to the invention are implemented illustratively in the form of an application specific integrated circuit including the functionality of both decoder and refresher, it will be appreciated that these aspects of the invention can be implemented independently, and may or may not be implemented in the same device or on the same memory array.

While the illustrative implementation described includes dual port controllers accessing four memory daughter boards each comprised of eight banks of memory with 128 Megabyte per bank, it will be appreciated that alternative implementations can include more, or less, than two port controllers accessing multiple banks of shared memory having greater than or less than that described herein.

While the shared memory banks in the embodiment disclosed herein are comprised of four daughter boards each of which has 16M×4 Dynamic Random Access Memory (DRAM) chips organized as eight banks of memory with 128 Megabytes per bank, it will be appreciated that alternative memory chips and bank configurations can be implemented according to the invention. Similarly, although each of the memory array decoder devices is connected to each of the port controllers via a control ASIC interface or bus that provides address signals and parity, and control signals and in the illustrative embodiment the control signals are comprised of three bits for bank select signals (BANK_SEL), four bits for column address select (CAS), four bits for row address select (RAS), and four bits for write enable signals (WR), it will be appreciated that other signals in addition to those signals, or fewer signals, can be passed on the interface bus, and the respective signals passed can have alternative bit configurations.

Further, although the decoder implementation described herein is implemented in the context of an illustrative Dynamic Ram multibank system, it should be appreciated that bank select decoding according to the invention can be implemented with other types of memory arrays, such as Static ram arrays or the like.

Although the invention is described herein with respect to illustrative embodiments thereof, it should be appreciated that the foregoing and various other changes, omissions or additions in the form and detail thereof may be made without departing from the spirit and scope of the invention.

What is claimed is:

1. A method for refreshing a non-clocked memory storing information from and providing information to a host, comprising the steps of:
   providing a refresh interface between said host and said non-clocked memory, to effect a refresh operation, said refresh interface comprising at least one refresh signal transferred from said host;
   issuing said at least one refresh signal to a refresh state machine to undertake said refresh operation; and
   issuing selectably timed column address refresh and row address refresh signals from said refresh state machine according to which said non-clocked memory is selectably refreshed, said selectably timed column address refresh and row address refresh signals having a predetermined selected level of overlap.

2. The method of claim 1 wherein said refresh operation is a Column Address Select (CAS) before Row Address Select (RAS) refresh.

3. The method of claim 1 wherein said at least one refresh signal comprises a refresh enable signal and a refresh strobe pulse train, said refresh strobe pulse train being a plurality of pulses that are issued only while said refresh enable signal is active.

4. The method of claim 1 wherein said refresh state machine issues refresh signals for refreshing at least two memory banks and said refresh signals are selectably overlapped to provide selected current and noise profiles during refresh.

5. The method of claim 1 wherein said refresh state machine issues refresh signals for refreshing at least two memory banks and said refresh signals are selectably overlapped to minimize time for refresh.

6. A method for refreshing a non-clocked memory storing information from and providing information to a host, comprising the steps of:
   providing a refresh interface between said host and said non-clocked memory, said refresh interface comprising a refresh enable signal and a refresh strobe pulse train, said refresh pulse train being a plurality of pulses that are issued only while said refresh enable signal is active;
   issuing said refresh enable signal and said refresh strobe pulse train to a refresh state machine to define a refresh operation; and
   issuing selectably timed column address refresh and row address refresh signals from said refresh state machine according to which said non-clocked memory is selectably refreshed, said selectably timed column address refresh and row address refresh signals having a predetermined selected level of overlap.

7. The method of claim 6 wherein said refresh state machine issues said refresh signals for refreshing at least two memory banks and said refresh signals are selectably overlapped to provide selected current and noise profiles during said refresh operation.

8. The method of claim 6 wherein said refresh state machine issues said refresh signals for refreshing at least two memory banks and said refresh signals are selectably overlapped to minimize time for refresh.

9. A modular memory system storing information from and providing information to a host, comprising:
   a memory array including a plurality of DRAM memory devices organized as at least two banks of memory; and
   a refresh state machine configured to issue selectably timed column address refresh and row address refresh signals according to which said DRAM memory devices are selectably refreshed, said selectably timed column address refresh and row address refresh signals having a predetermined selected level of overlap.

10. The modular memory system of claim 9 wherein refresh state machine is implemented as a programmable logic device.

11. The modular memory system of claim 9 wherein said refresh signals are selectably overlapped to provide selected current and noise profiles during refresh.

12. The modular memory system of claim 9 wherein said refresh signals are selectably overlapped to minimize time for refresh.

13. The modular memory system of claim 9 further including at least one port controller effecting a refresh interface between said host and said refresh state machine, said refresh interface comprising a refresh enable signal and a refresh strobe pulse train, said refresh pulse train being a plurality of pulses that are issued only while said refresh enable signal is active.

14. The modular memory system of claim 9 further including at least one port controller, which comprises a first port controller and a second port controller configured so that each port can access the shared memory as a fully independent channel.

15. The modular memory system of claim 9 wherein said at least two memory banks are configured on four daughter boards each of which has 16M×4 Dynamic Random Access Memory (DRAM) chips organized as eight banks of memory with 128 Megabytes per bank, and each of said four daughter boards includes a respective combinatorial decoding device.

16. The method of claim 14 wherein said first port controller and said second port controller are configured to determine status of all ports in said system and a rate of refresh of said memory array is adjusted as a function of available port controllers by adjusting one of frequency of refresh and a refresh clock signal.

* * * * *